US010515932B2

(12) United States Patent
Tsuji

(10) Patent No.: US 10,515,932 B2
(45) Date of Patent: Dec. 24, 2019

(54) SEMICONDUCTOR CHIP STACK WITH IDENTIFICATION SECTION ON CHIP SIDE-SURFACES FOR STACKING ALIGNMENT

(71) Applicant: PS4 Luxco S.a.r.l., Luxembourg (LU)

(72) Inventor: Daisuke Tsuji, Tokyo (JP)

(73) Assignee: LONGITUDE LICENSING LIMITED, Dublin (IE)

( * ) Notice: Subject to any disclaimer, the term of this patent is extended or adjusted under 35 U.S.C. 154(b) by 0 days.

(21) Appl. No.: 14/900,067

(22) PCT Filed: Jun. 13, 2014

(86) PCT No.: PCT/JP2014/065687
§ 371 (c)(1),
(2) Date: Dec. 18, 2015

(87) PCT Pub. No.: WO2014/203807
PCT Pub. Date: Dec. 24, 2014

(65) Prior Publication Data
US 2016/0141273 A1    May 19, 2016

(30) Foreign Application Priority Data

Jun. 21, 2013  (JP) .................................. 2013-130330

(51) Int. Cl.
*H01L 25/065*    (2006.01)
*H01L 23/544*    (2006.01)
(Continued)

(52) U.S. Cl.
CPC ...... *H01L 25/0657* (2013.01); *H01L 23/3135* (2013.01); *H01L 23/544* (2013.01);
(Continued)

(58) Field of Classification Search
CPC .............. H01L 25/0657; H01L 23/544; H01L 2225/06513; H01L 2225/06517;
(Continued)

(56) References Cited

U.S. PATENT DOCUMENTS 4,499,655 A * 2/1985 Anthony ............. H01L 23/5385
205/123
6,087,719 A * 7/2000 Tsunashima ...... H01L 21/76898
250/548
(Continued)

FOREIGN PATENT DOCUMENTS

JP         06005729      1/1994
JP       2012028809      2/2012
(Continued)

OTHER PUBLICATIONS

Murakami et al., Laser Step Alignment for a Wafer Stepper, Proc. SPIE 0538, Optical Microlithography IV, (Jul. 23, 1985).*
(Continued)

*Primary Examiner* — Cuong Q Nguyen
*Assistant Examiner* — Shih Tsun A Chou
(74) *Attorney, Agent, or Firm* — Kunzler Bean & Adamson

(57) ABSTRACT

This semiconductor device is formed by stacking a plurality of semiconductor chips that each have a plurality of bump electrodes, each of the plurality of semiconductor chips being provided with an identification section formed on a respective side face. Each semiconductor chip has a similar arrangement for its respective plurality of bump electrodes, and each identification section is formed so that the positional relationship with a respective reference bump electrode provided at a specific location among the respective plurality of bump electrodes is the same in each semiconductor chip. The plurality of semiconductor chips are stacked such that the bump electrodes provided thereon are electrically connected in the order of stacking of the semiconductor chips, while the side faces on which the identification sections are formed are oriented in the same direction.

7 Claims, 18 Drawing Sheets

(51) Int. Cl.
*H01L 25/00* (2006.01)
*H01L 23/31* (2006.01)
*H01L 23/00* (2006.01)
H01L 21/683 (2006.01)
H01L 21/56 (2006.01)

(52) U.S. Cl.
CPC .............. *H01L 24/97* (2013.01); *H01L 25/50* (2013.01); *H01L 21/561* (2013.01); *H01L 21/568* (2013.01); *H01L 21/6836* (2013.01); *H01L 24/13* (2013.01); *H01L 24/81* (2013.01); *H01L 2221/68327* (2013.01); *H01L 2223/54426* (2013.01); *H01L 2223/54473* (2013.01); *H01L 2224/0401* (2013.01); *H01L 2224/05572* (2013.01); *H01L 2224/131* (2013.01); *H01L 2224/13009* (2013.01); *H01L 2224/13082* (2013.01); *H01L 2224/13147* (2013.01); *H01L 2224/13564* (2013.01); *H01L 2224/13582* (2013.01); *H01L 2224/13644* (2013.01); *H01L 2224/13655* (2013.01); *H01L 2224/14181* (2013.01); *H01L 2224/16145* (2013.01); *H01L 2224/16225* (2013.01); *H01L 2224/32225* (2013.01); *H01L 2224/73204* (2013.01); *H01L 2224/75744* (2013.01); *H01L 2224/75745* (2013.01); *H01L 2224/81005* (2013.01); *H01L 2224/8113* (2013.01); *H01L 2224/81192* (2013.01); *H01L 2224/81193* (2013.01); *H01L 2224/81203* (2013.01); *H01L 2224/83192* (2013.01); *H01L 2224/97* (2013.01); *H01L 2225/06513* (2013.01); *H01L 2225/06517* (2013.01); *H01L 2225/06541* (2013.01); *H01L 2225/06565* (2013.01); *H01L 2225/06593* (2013.01); *H01L 2924/15311* (2013.01)

(58) Field of Classification Search
CPC . H01L 2225/06593; H01L 2223/54426; H01L 2224/8113
See application file for complete search history.

(56) References Cited

U.S. PATENT DOCUMENTS

| | | | | |
|---|---|---|---|---|
| 6,611,052 B2* | 8/2003 | Poo | ........................ | H01L 23/481 257/686 |
| 7,477,523 B2* | 1/2009 | Tsuji | ..................... | H01L 21/561 174/262 |
| 7,829,998 B2* | 11/2010 | Do | ..................... | H01L 21/6835 257/698 |
| 7,875,973 B2* | 1/2011 | Chiu | ................. | H01L 23/49805 257/723 |
| 8,008,126 B2* | 8/2011 | Jeung | .................. | H01L 23/3114 257/E21.499 |
| 8,350,373 B2* | 1/2013 | Wu | ................... | H01L 21/76898 257/686 |
| 8,350,389 B2* | 1/2013 | Itaya | ..................... | H01L 21/563 174/255 |
| 8,575,763 B2* | 11/2013 | Yoshida | .............. | H01L 21/6835 257/621 |
| 8,623,702 B2* | 1/2014 | Pagaila | ................... | H01L 24/03 438/107 |
| 8,765,526 B2* | 7/2014 | Ide | ....................... | H01L 23/481 257/E21.499 |
| 8,884,445 B2* | 11/2014 | Lee | ...................... | H01L 23/544 257/686 |
| 8,924,903 B2* | 12/2014 | Ide | ........................ | H01L 23/481 716/110 |
| 8,981,558 B2* | 3/2015 | Ide | ........................ | H01L 23/498 257/737 |
| 8,987,009 B1* | 3/2015 | Chen | ....................... | H01L 22/26 257/48 |
| 9,052,187 B2* | 6/2015 | Komuta | ................ | G01B 11/272 |
| 9,070,748 B2* | 6/2015 | Kang | .................. | H01L 21/7684 |
| 9,252,091 B2* | 2/2016 | Ide | .................... | H01L 23/49811 |
| 2004/0124523 A1* | 7/2004 | Poo | .................. | H01L 23/49805 257/698 |
| 2005/0167812 A1* | 8/2005 | Yoshida | ............ | H01L 21/76898 257/686 |
| 2006/0139643 A1* | 6/2006 | Chen | ....................... | G03F 9/703 356/401 |
| 2010/0007001 A1* | 1/2010 | Wang | .................... | H01L 23/481 257/686 |
| 2010/0261311 A1* | 10/2010 | Tsuji | ...................... | H01L 21/561 438/109 |
| 2011/0049696 A1* | 3/2011 | Haba | .................. | H01L 21/6835 257/686 |
| 2011/0084722 A1* | 4/2011 | Nishioka | .................. | G11C 5/02 324/762.01 |
| 2011/0089555 A1* | 4/2011 | Shau | ....................... | H01L 21/561 257/690 |
| 2011/0156284 A1* | 6/2011 | Zhang | ..................... | H01L 22/34 257/797 |
| 2012/0056315 A1* | 3/2012 | Chang | ................. | H01L 21/6835 257/737 |
| 2012/0074593 A1* | 3/2012 | Wu | .................... | H01L 21/76898 257/777 |
| 2012/0134193 A1* | 5/2012 | Ide | ........................ | H01L 23/481 365/51 |
| 2012/0142146 A1* | 6/2012 | Sasaki | ................ | H01L 25/0657 438/113 |
| 2012/0184068 A1* | 7/2012 | Abe | ....................... | H01L 21/561 438/107 |
| 2012/0217644 A1* | 8/2012 | Pagaila | .................... | H01L 24/03 257/774 |
| 2012/0256300 A1 | 10/2012 | Nakamura | | |
| 2013/0065360 A1 | 3/2013 | Wimplinger | | |
| 2013/0091312 A1* | 4/2013 | Ken | ........................ | G06F 13/42 710/106 |
| 2013/0241025 A1* | 9/2013 | Pagani | .................. | H01L 21/768 257/499 |
| 2013/0249085 A1* | 9/2013 | Ide | .................... | H01L 23/49811 257/737 |
| 2013/0250298 A1* | 9/2013 | Komuta | ............... | G01B 11/272 356/400 |
| 2014/0015144 A1* | 1/2014 | Kim | .................... | H01L 25/0657 257/774 |
| 2014/0035161 A1* | 2/2014 | Yoshida | .............. | H01L 21/6835 257/774 |
| 2015/0084166 A1* | 3/2015 | Ide | ........................ | H01L 23/481 257/621 |
| 2015/0214207 A1* | 7/2015 | Yoshida | .............. | H01L 25/0657 438/109 |

FOREIGN PATENT DOCUMENTS

| | | |
|---|---|---|
| JP | 2013118312 | 6/2013 |
| JP | 2013-197412 | 9/2013 |
| TW | 201027692 A1 | 7/2010 |
| WO | 2012133760 | 10/2012 |

OTHER PUBLICATIONS

Fuller, Wafer Alignment for Canon Stepper, 2008.*
Application No. PCT/JP2014/065687, International Search Report, dated Sep. 22, 2014.

* cited by examiner

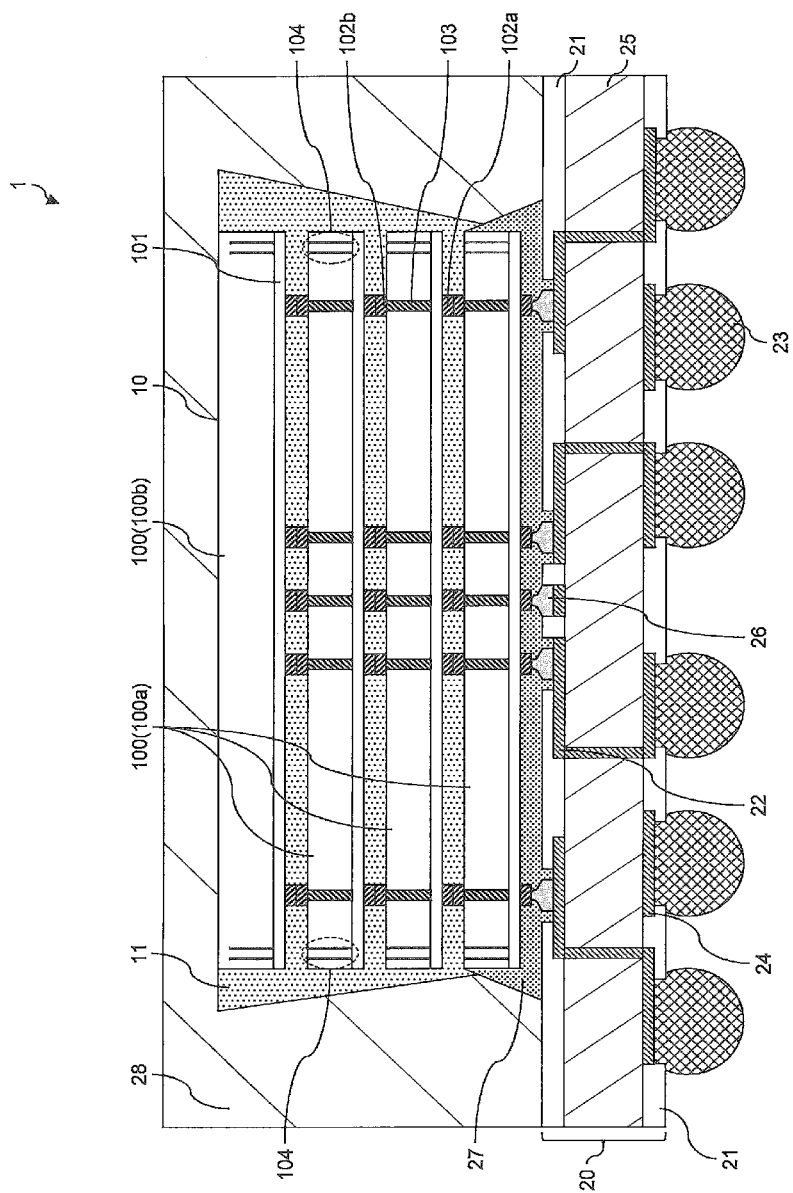
[Fig 1]

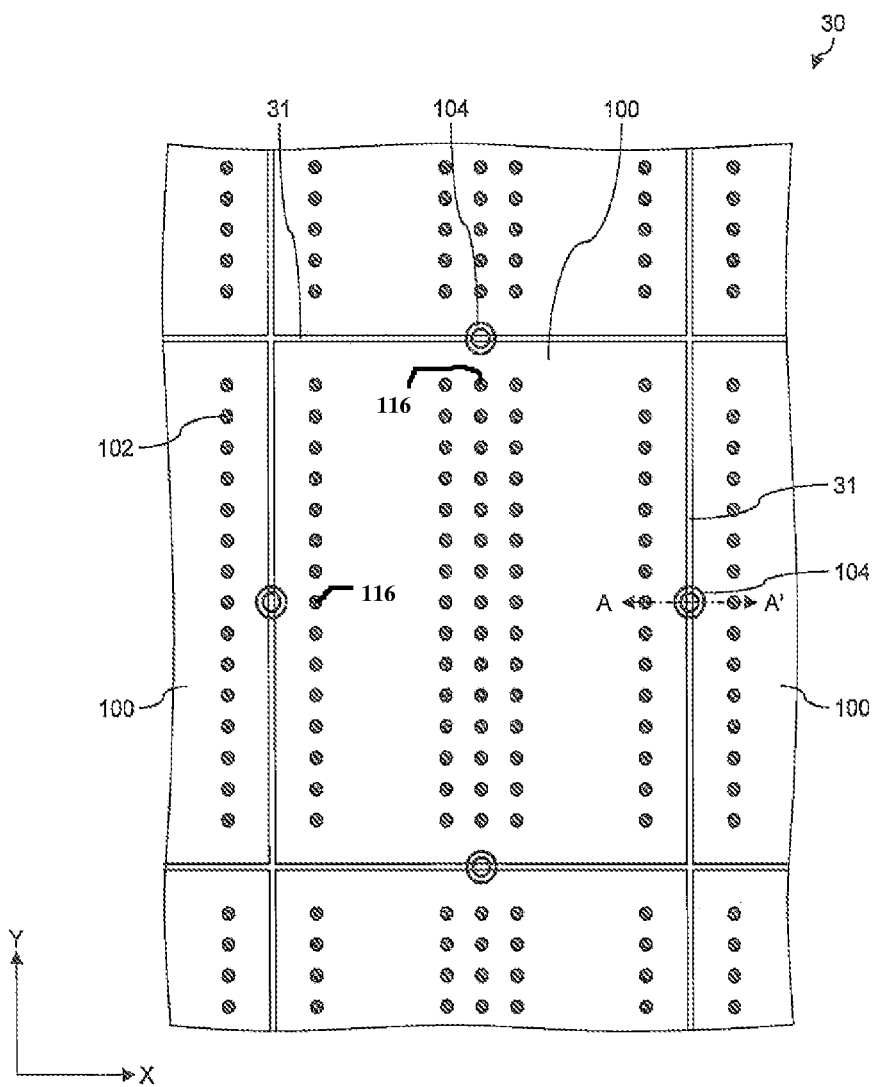
[Fig 2]

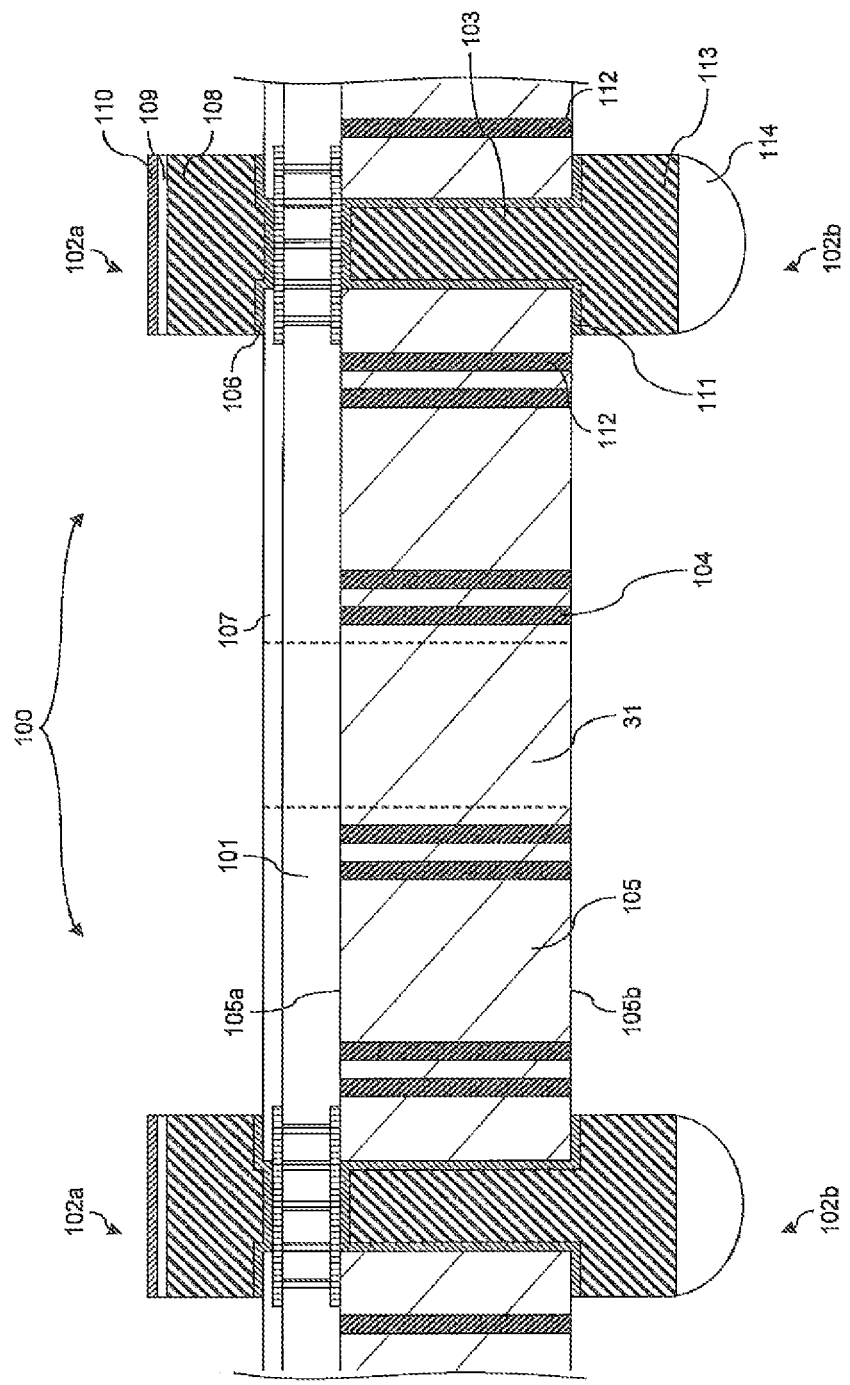
[Fig 3]

[Fig 4A]
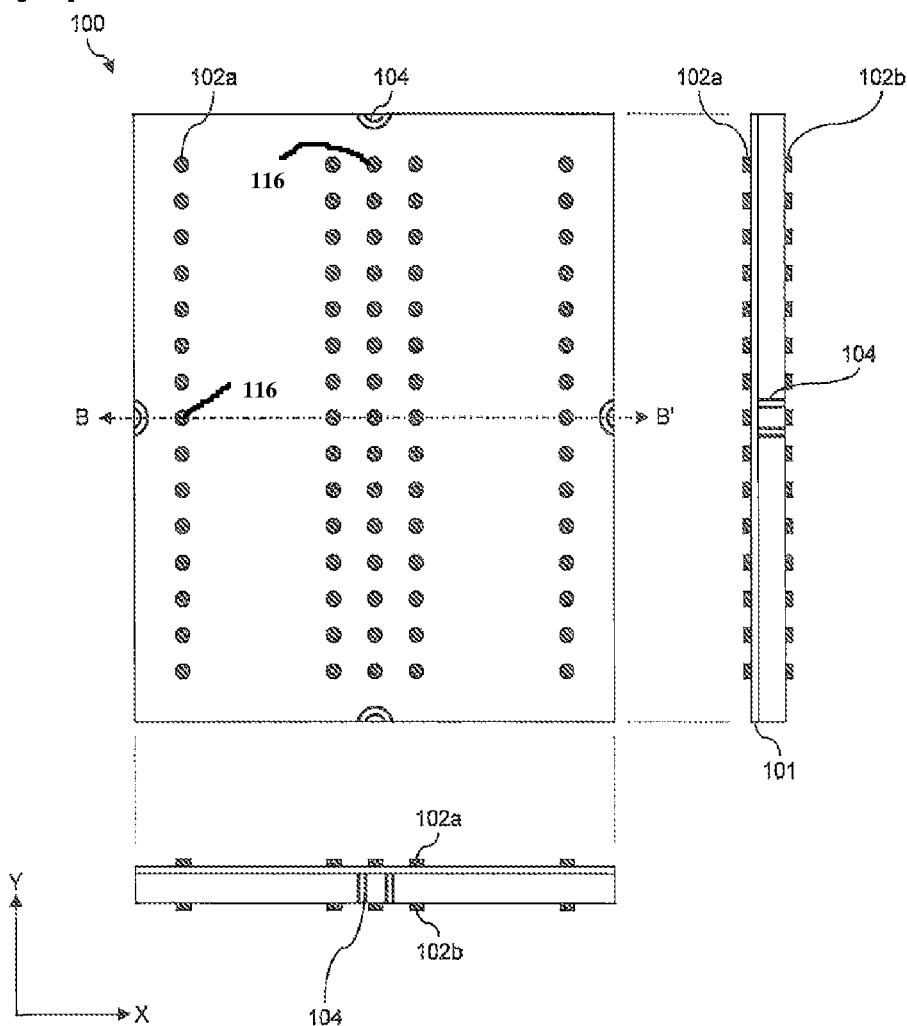
[Fig 4B]
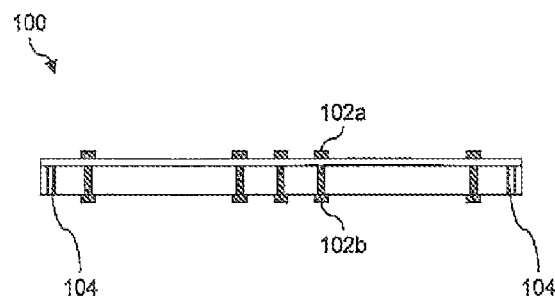

[Fig 5A]
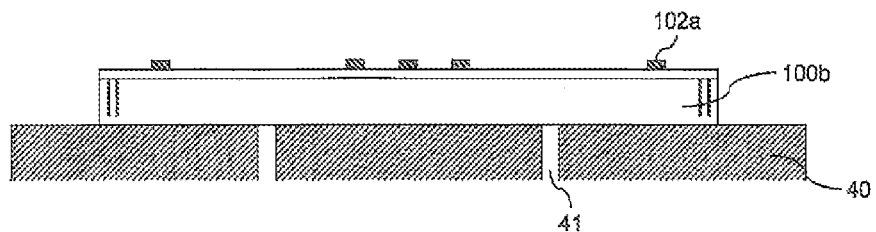
[Fig 5B]
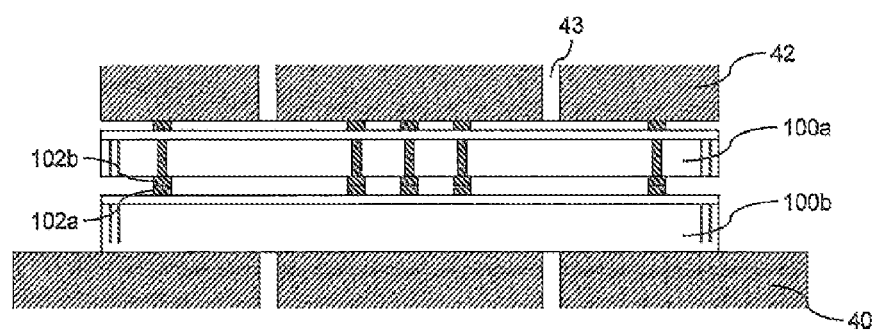
[Fig 5C]
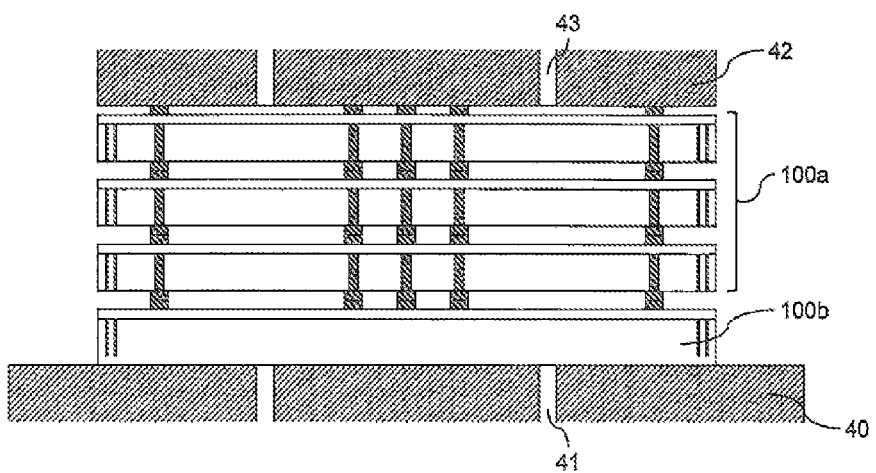

[Fig 5D]
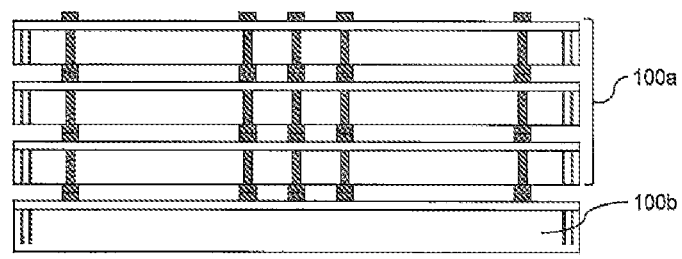
[Fig 6A]
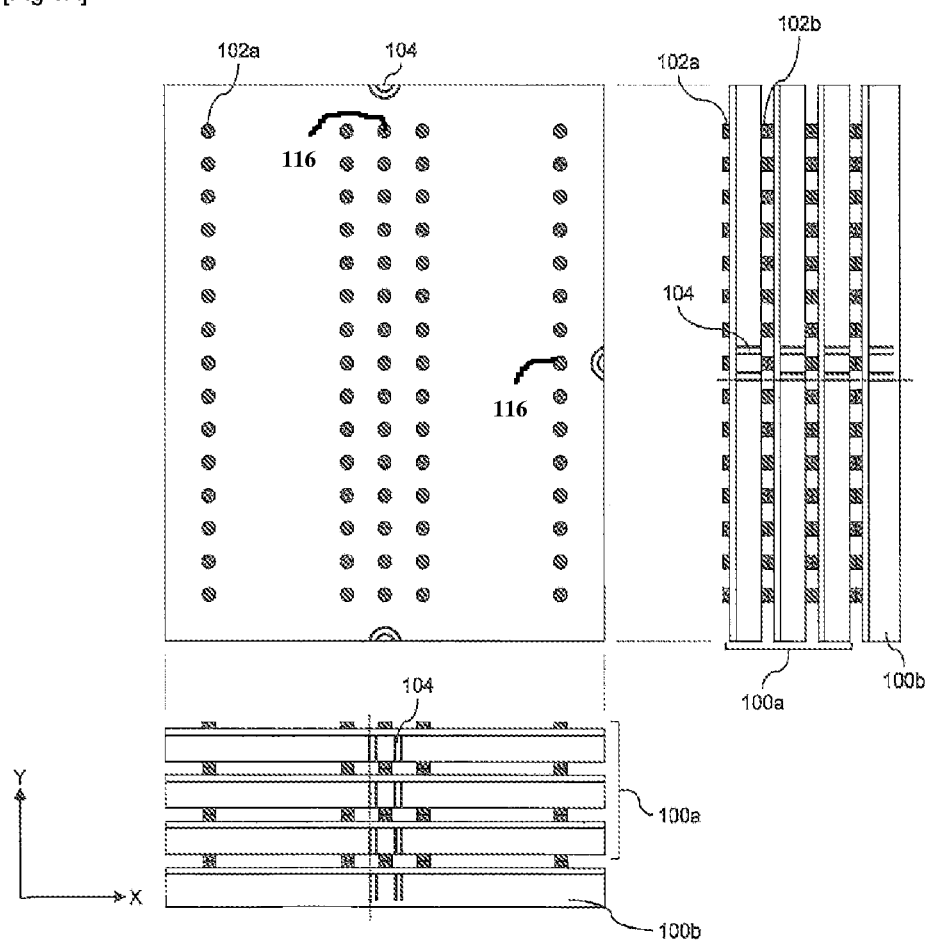

[Fig 6B]
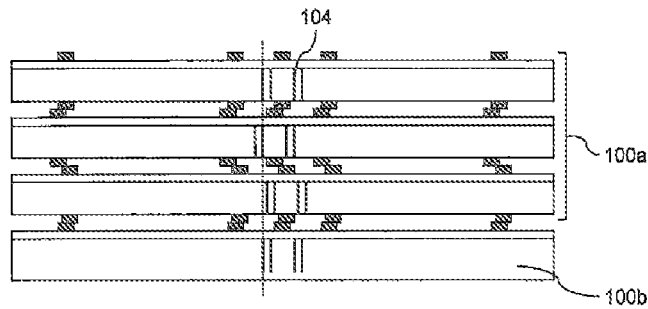
[Fig 6C]
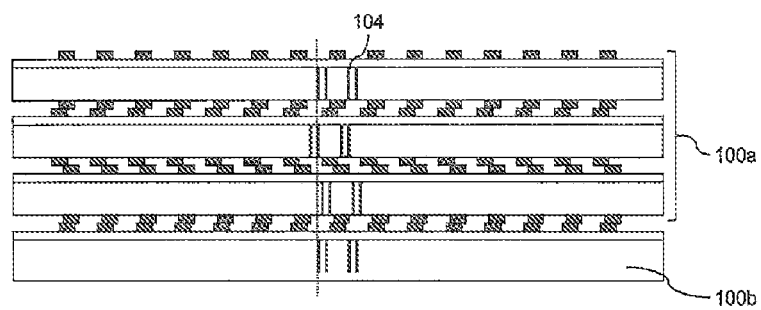
[Fig 7A]
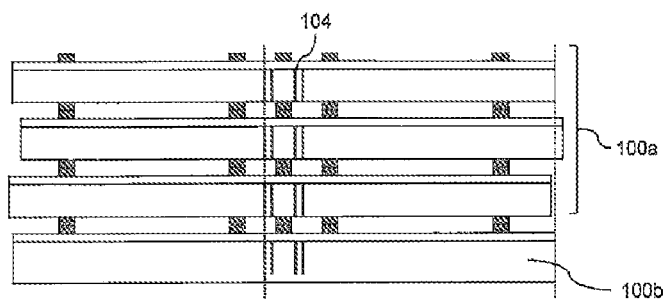

[Fig 7B]
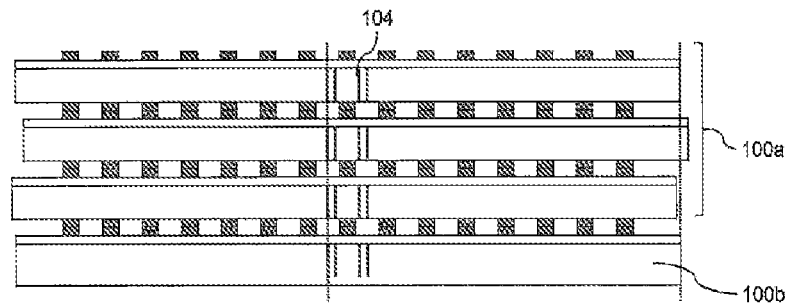
[Fig 8A]
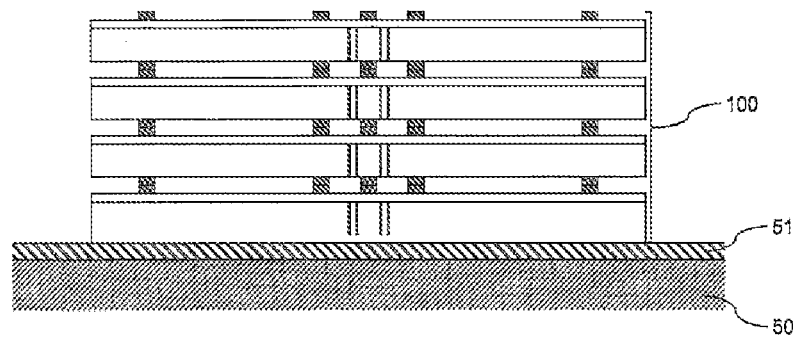
[Fig 8B]
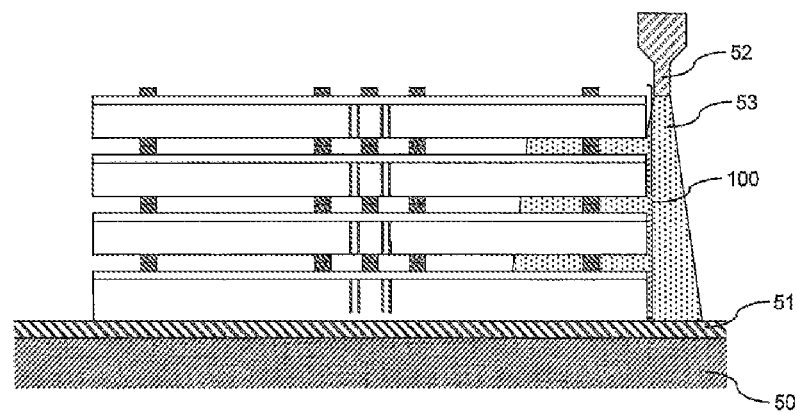

[Fig 8C]
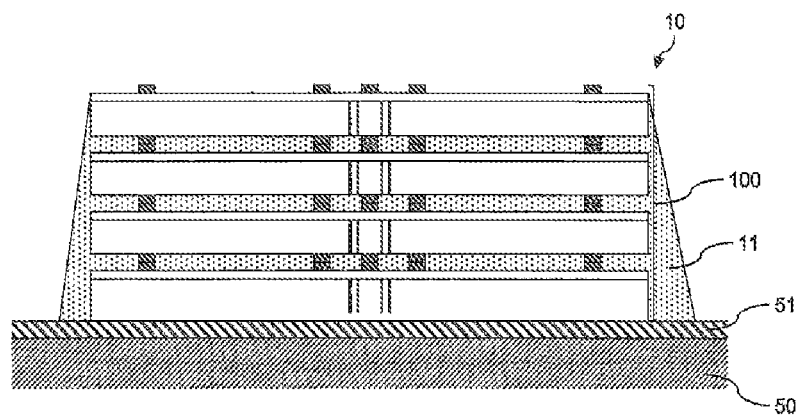
[Fig 8D]
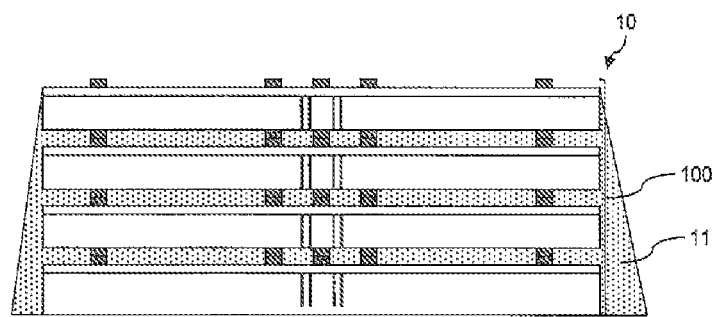

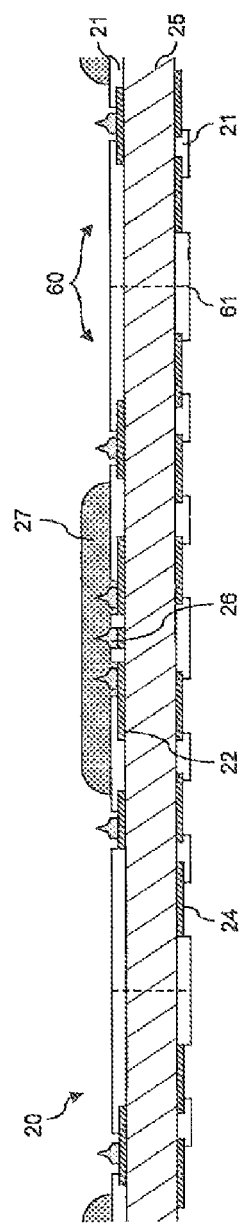

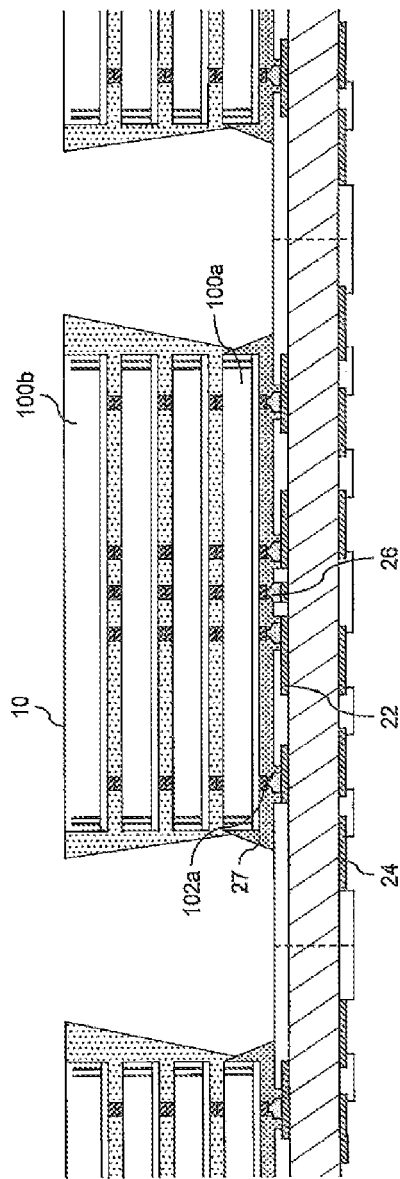
[Fig 9B]

[Fig 9C]
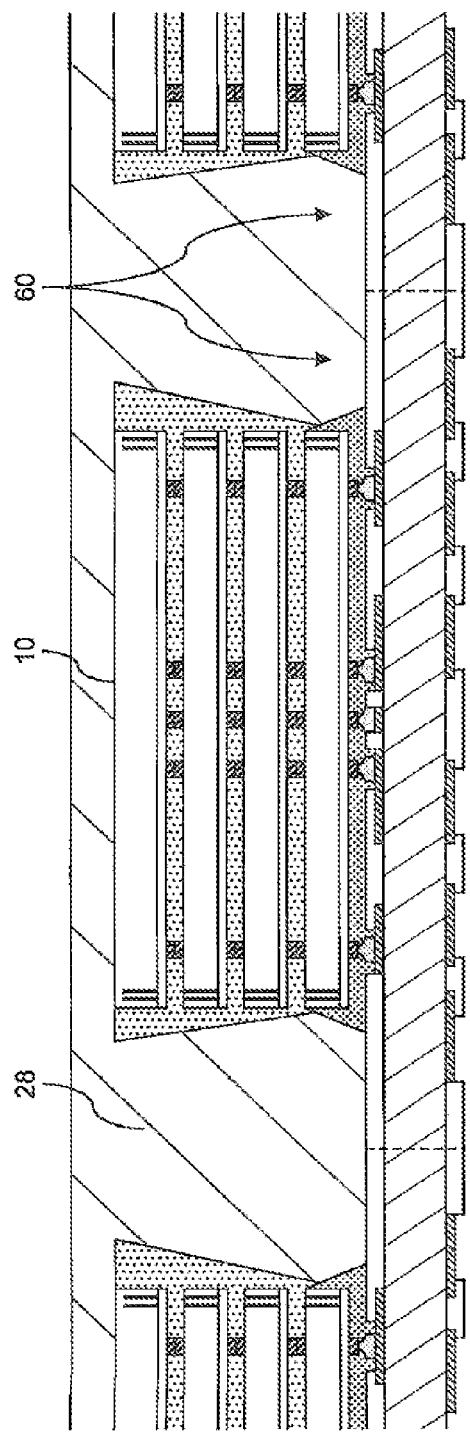

[Fig 9D]
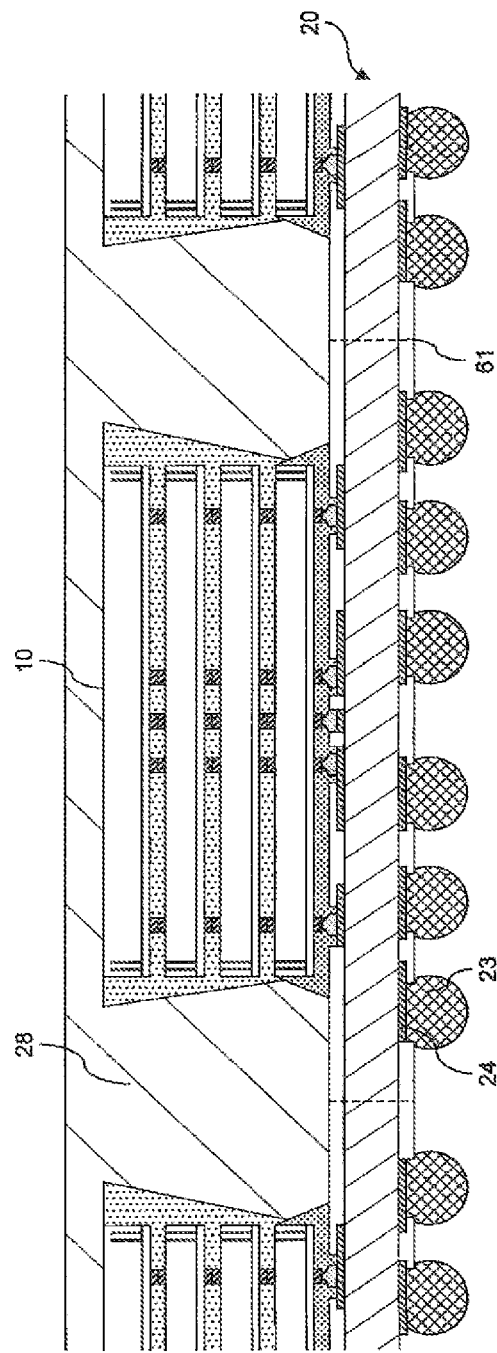

[Fig 9E]
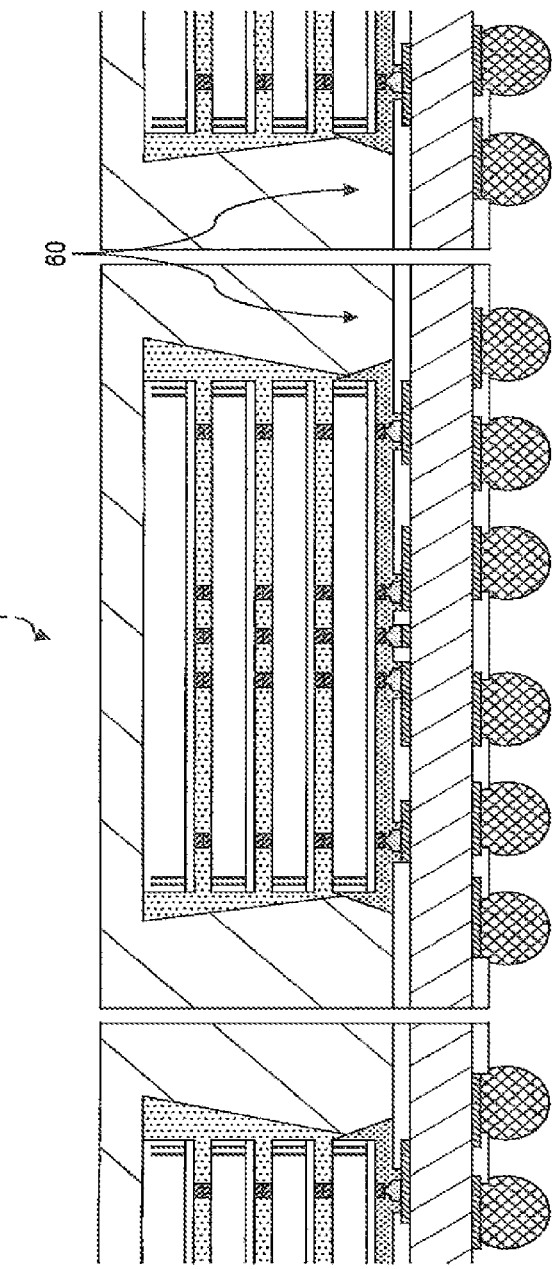

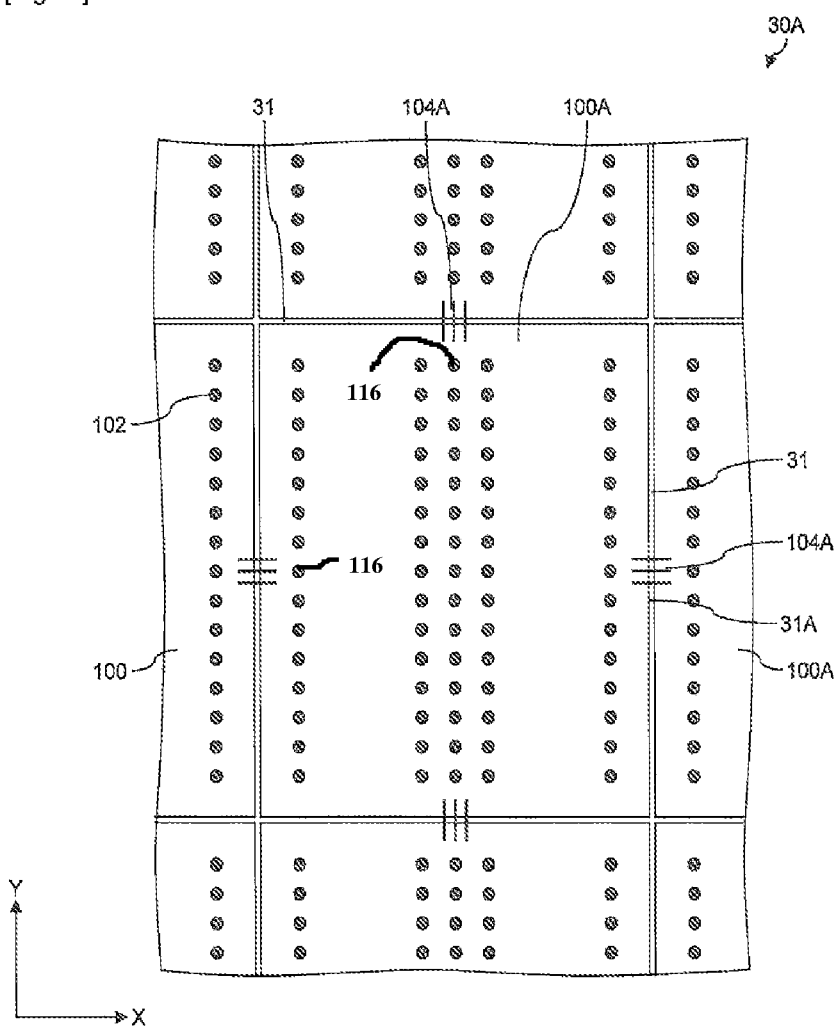
[Fig 10]

[Fig 11A]
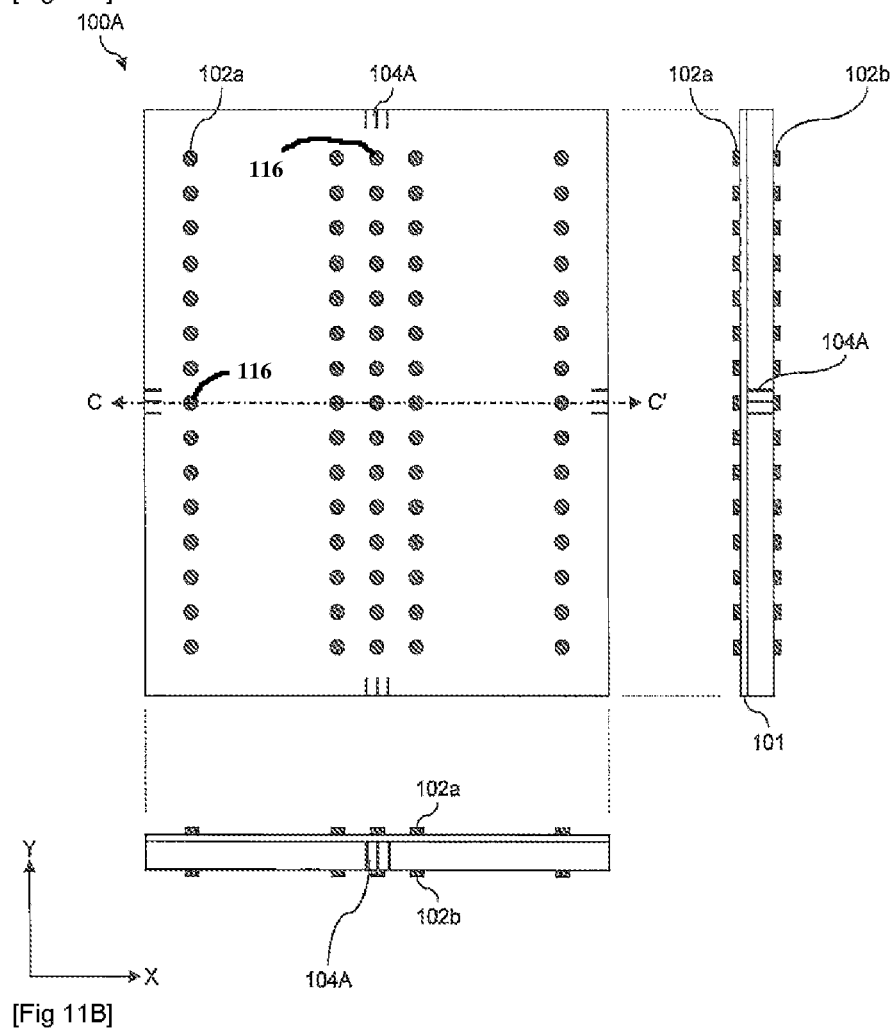
[Fig 11B]
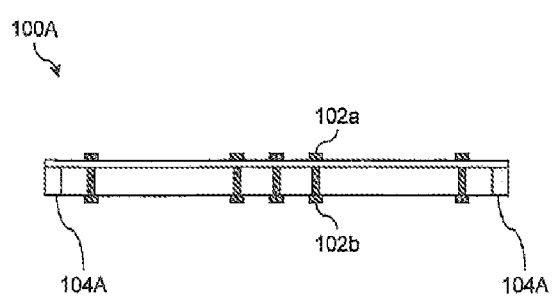

[Fig 12A]
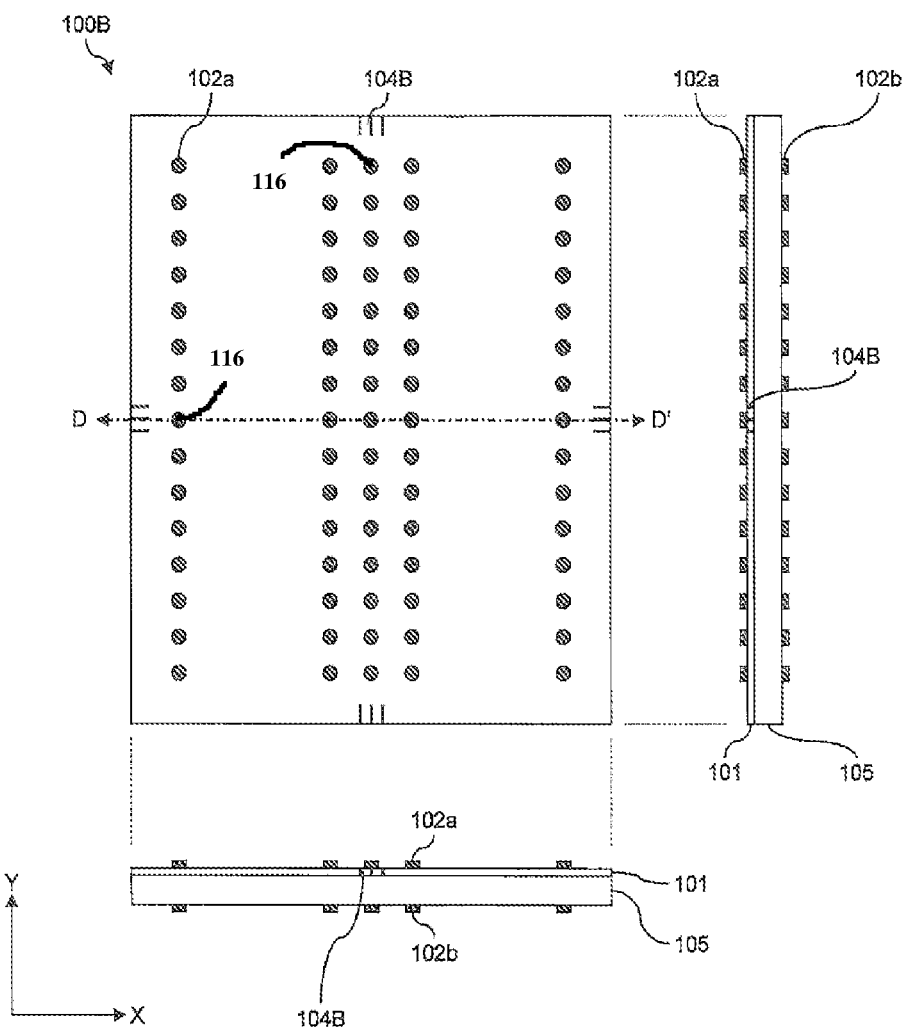
[Fig 12B]
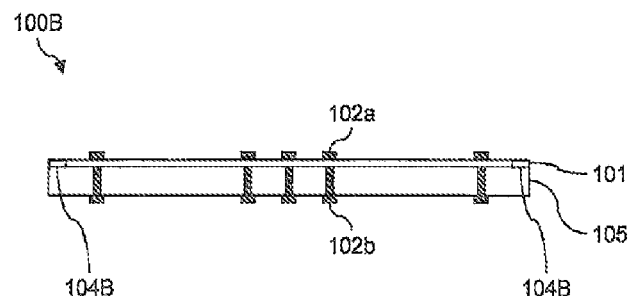

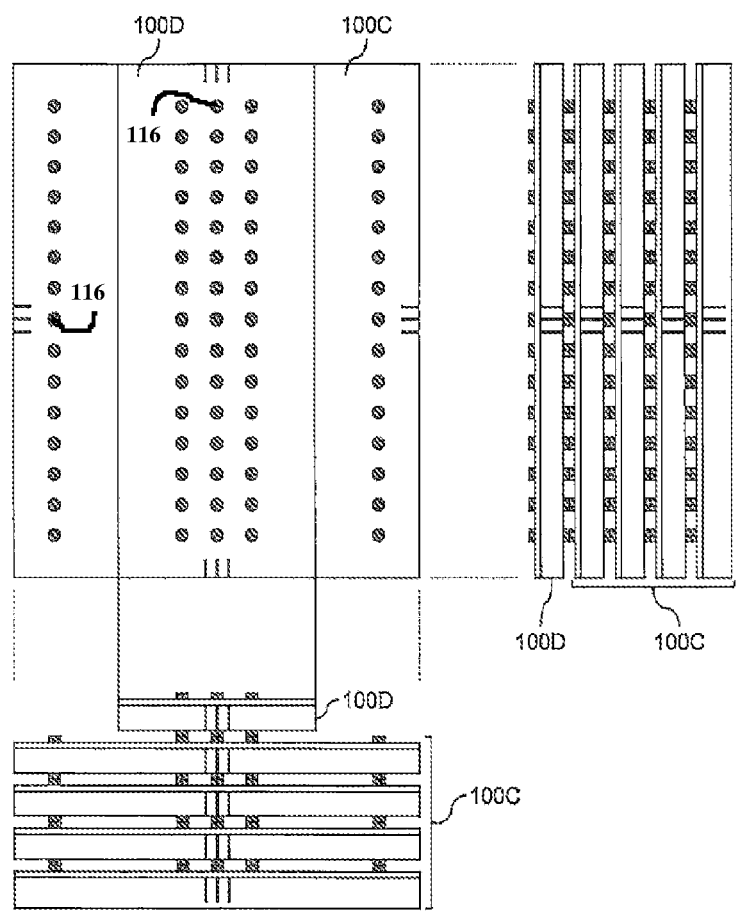

US 10,515,932 B2

SEMICONDUCTOR CHIP STACK WITH IDENTIFICATION SECTION ON CHIP SIDE-SURFACES FOR STACKING ALIGNMENT

TECHNICAL FIELD

The present invention relates to a semiconductor device.

BACKGROUND

There is a growing demand for higher mounting density of semiconductor chips as electronic devices become more compact and higher performing. In response to this requirement, investigations have been carried out into chip-on-chip (CoC) semiconductor devices in which a plurality of semiconductor chips having through-electrodes are mounted.

Patent Document 1 (JP 2010-251347 A) indicates that a plurality of semiconductor chips which are connected to through-electrodes and have bump electrodes projecting from a substrate surface are mounted (flip-chip stacked) in such a way that the bump electrodes of the semiconductor chips above and below are connected, and the space between semiconductor chips is filled with an underfill, which is a sealing resin, in order to form a chip stack, after which the chip stack is fixed on a wiring board.

PATENT DOCUMENT

Patent Document 1: JP 2010-251347

SUMMARY OF THE INVENTION

Problem to be Solved by the Invention

Bump electrodes normally have a very small diameter of the order of 20 μm and are formed at a narrow pitch of the order of 40 μm. When a plurality of semiconductor chips are flip-chip mounted, the bump electrodes of the semiconductor chips may therefore be misaligned, depending on the mounting accuracy.

Here, the bump electrodes are formed in a central region of the semiconductor chip and therefore it is difficult to detect misalignment between the bump electrodes on the stacked semiconductor chips, and the extent of any such misalignment.

Moreover, when a semiconductor wafer on which a plurality of semiconductor chips are formed is diced and cut into individual semiconductor chips, the distance from the ends of the semiconductor chips to the bump electrodes may differ for each semiconductor chip, depending on the dicing accuracy. It is therefore also difficult to detect misalignment between the bump electrodes on the basis of the positions of the ends of the stacked semiconductor chips, and the extent of any such misalignment.

Means for Solving the Problem

A semiconductor device according to a mode of the present invention comprises a plurality of stacked semiconductor chips each having a plurality of bump electrodes, wherein the plurality of semiconductor chips comprise an identification section formed on the side surfaces thereof, the plurality of bump electrodes are arranged in the same way on the semiconductor chips, and the identification sections are formed in such a way as to have the same positional relationship with a reference bump electrode, from among the plurality of bump electrodes, which is provided at a specific location, and the plurality of semiconductor chips are stacked in such a way that the bump electrodes provided thereon are electrically connected in the stacking order of the semiconductor chips and in such a way that the side surfaces on which the identification sections are formed are oriented in the same direction.

A semiconductor device according to a different mode of the present invention is provided with:

a first semiconductor chip comprising: a first main surface, a second main surface opposite the first main surface, a first side surface joining the first main surface and the second main surface, a first bump electrode formed on the first main surface, and a first identification section which corresponds to the first bump electrode and is formed on the first side surface; and a second semiconductor chip comprising: a third main surface, a fourth main surface opposite the third main surface, a second side surface joining the third main surface and the fourth main surface, a second bump electrode which corresponds to the first bump electrode and is formed on the third main surface, a third bump electrode which is electrically connected to the second bump electrode and is formed on the fourth main surface, and a second identification section which is formed on the second side surface with the same positional relationship with respect to the second bump electrode as the positional relationship between the first bump electrode and the first identification section, said second semiconductor chip being stacked on the first semiconductor chip in such a way that the second bump electrode is connected to the first bump electrode and the first side surface and the second side surface are oriented in the same direction.

Advantage of the Invention

The present invention makes it possible to easily detect misalignment between bump electrodes on stacked semiconductor chips, and the extent of any such misalignment.

BRIEF DESCRIPTION OF THE FIGURES

FIG. 1 is a view in cross section showing an example of the schematic configuration of a semiconductor device according to a first mode of embodiment of the present invention;

FIG. 2 is a plan view of a semiconductor wafer on which semiconductor chips shown in FIG. 1 are formed;

FIG. 3 is a view in cross section between A-A' shown in FIG. 2;

FIG. 4A depicts a plan view and side views of the semiconductor chip shown in FIG. 1;

FIG. 4B is a view in cross section between B-B' shown in FIG. 4A;

FIG. 5A is a view in cross section showing a step of stacking the semiconductor chips shown in FIG. 1;

FIG. 5B is a view in cross section showing a step of stacking the semiconductor chips shown in FIG. 1;

FIG. 5C is a view in cross section showing a step of stacking the semiconductor chips shown in FIG. 1;

FIG. 5D is a view in cross section showing a step of stacking the semiconductor chips shown in FIG. 1;

FIG. 6A depicts a top view and side views of the stacked semiconductor chips shown in FIG. 5D;

FIG. 6B is a side view of the stacked semiconductor chips shown in FIG. 5D;

FIG. 6C is a side view of the stacked semiconductor chips shown in FIG. 5D;

FIG. 7A is a side view of the stacked semiconductor chips shown in FIG. 5D;

FIG. 7B is a side view of the stacked semiconductor chips shown in FIG. 5D;

FIG. 8A is a view in cross section showing a step of filling a chip stack shown in FIG. 1 with a resin member;

FIG. 8B is a view in cross section showing a step of filling a chip stack shown in FIG. 1 with a resin member;

FIG. 8C is a view in cross section showing a step of filling a chip stack shown in FIG. 1 with a resin member;

FIG. 8D is a view in cross section showing a step of filling a chip stack shown in FIG. 1 with a resin member;

FIG. 9A is a view in cross section showing a step of assembling the semiconductor device shown in FIG. 1;

FIG. 9B is a view in cross section showing a step of assembling the semiconductor device shown in FIG. 1;

FIG. 9C is a view in cross section showing a step of assembling the semiconductor device shown in FIG. 1;

FIG. 9D is a view in cross section showing a step of assembling the semiconductor device shown in FIG. 1;

FIG. 9E is a view in cross section showing a step of assembling the semiconductor device shown in FIG. 1;

FIG. 10 is a plan view of a semiconductor wafer on which are formed semiconductor chips according to a second mode of embodiment of the present invention;

FIG. 11A depicts a top view and side views of the semiconductor chip shown in FIG. 10;

FIG. 11B is a view in cross section between C-C' shown in FIG. 11A;

FIG. 12A depicts a top view and side views of a semiconductor chip according to a third mode of embodiment of the present invention;

FIG. 12B is a view in cross section between D-D' shown in FIG. 12A; and

FIG. 13 shows another example of the schematic configuration of a semiconductor device according to the present invention.

MODE OF EMBODIMENT OF THE INVENTION

Modes of embodiment of the present invention will be described below with reference to the figures.

First Mode of Embodiment

FIG. 1 is a view in cross section showing the schematic configuration of a semiconductor device 1 according to a first mode of embodiment of the present invention. The semiconductor device according to the present invention is what is known as a CoC semiconductor device in which a stack of semiconductor chips (chip stack) is mounted on a wiring board. Constituent elements which are the same bear the same reference symbols in the figures below and duplicate descriptions will not be given.

The semiconductor device 1 shown in FIG. 1 has a structure in which a chip stack 10 comprising a plurality of stacked semiconductor chips 100 is connected to a wiring board 20. The chip stack 10 has a structure in which four memory chips in which a memory is formed are stacked, for example.

The semiconductor chip 100 comprises a plurality of bump electrodes 102 which are formed on a surface (front surface) on which a circuit-formation layer 101 is formed and on a surface (rear surface) opposite the front surface.

The bump electrodes 102 formed on the front surface may be referred to below as front-surface bump electrodes 102a, while the bump electrodes 102 formed on the rear surface may be referred to below as rear-surface bump electrodes 102b. The front-surface bump electrodes 102a and the rear-surface bump electrodes 102b of the semiconductor chip 100 are connected by means of through-electrodes 103. The semiconductor chips 100 are stacked in such a way that when the front surface of one semiconductor chip 100 is facing the rear surface of another semiconductor chip 100, the front-surface bump electrode 102a of the first semiconductor chip 100 is electrically connected to the rear-surface bump electrode 102b of the other semiconductor chip 100. As a result, the semiconductor chips 100 are connected to one another by means of the through-electrodes 103 via the bump electrodes 102.

Furthermore, an identification section 104 is formed on the semiconductor chips 100 in such a way that at least a part thereof is exposed at a side surface joining the front surface and the rear surface. The identification section 104 is formed by filling a trench provided in a substrate of the semiconductor chips 100 with an insulating member. The semiconductor chips 100 are stacked in such a way that the side surfaces on which the identification section 104 is formed are oriented in the same direction.

It should be noted that the semiconductor chip 100 furthest from the wiring board 20 does not have a rear-surface bump electrode 102b or a through-electrode 103. Among the semiconductor chips 100 forming the chip stack 10, semiconductor chips 100 having bump electrodes 102 on both surfaces may be referred to as semiconductor chips 100a, while semiconductor chips 100 having bump electrodes only on the front surface may be referred to as semiconductor chips 100b. The semiconductor chips 100b do not have the through electrodes 103, so they are thinner than the semiconductor chips 100a.

The chip stack 10 is provided with a resin member 11 which fills the gaps between the semiconductor chips 100 and has a substantially trapezoidal cross-sectional shape when viewed from the side surface. The resin member 11 is formed using an underfill material, for example.

The wiring board 20 on which predetermined wiring is formed is fixedly connected to the semiconductor chip 100 disposed on the short (upper base) side of the substantially trapezoidal resin member 11. A glass epoxy substrate having predetermined wiring formed on both surfaces is used for the wiring board 20, for example. The wiring, excluding connection pads and lands which will be described later, is covered by means of an insulating film 21 such as a solder resist film.

A plurality of connection pads 22 for connecting to the chip stack 10 are formed on one surface of the wiring board 20, while a plurality of lands 24 for connecting solder balls 23 serving as external electrodes are formed on the other surface thereof. The connection pads 22 and the lands 24 are connected by means of wiring formed within an insulating base material 25. The lands 24 are formed in the shape of a lattice, for example, at predetermined intervals on said other surface of the wiring board 20.

Stud bumps 26 made of Au or Cu, for example, are formed on the surface of the connection pads 22 on the chip stack 10 side. The stud bumps 26 are connected to the bump electrodes 102 of the semiconductor chips 100. The chip stack 10 and the wiring board 20 are bonded and fixed by means of a resin member 27 such as a nonconductive paste (NCP). The connection sites of the stud bumps 26 and the bump electrodes 102 are protected by means of the resin member 27.

The chip stack 10 on the wiring board 20 is sealed by means of a sealing resin 28. The solder balls 23 are connected to the plurality of lands 24 on said other surface of the wiring board 20 on which the chip stack 10 is not mounted.

The configuration of the semiconductor chips 100 (semiconductor chips 100a having the bump electrodes 102 on both surfaces) will be described next.

FIG. 2 is a top view of a semiconductor wafer 30 on which the semiconductor chips 100 are formed.

A plurality of semiconductor chips 100 defined by dicing areas 31 are formed on the semiconductor wafer 30. The semiconductor chips 100 are cut into individual chips as a result of the semiconductor wafer 30 being diced along the dicing areas 31.

A plurality of lines of bump electrodes 102 formed at a predetermined pitch interval in a predetermined direction are arranged on the semiconductor chips 100. The direction of the lines of bump electrodes 102 will be referred to below as the Y-direction, while the direction orthogonal to the Y-direction in which the lines of bump electrodes 102 are arranged will be referred to as the X-direction.

Furthermore, the identification sections 104 are formed on the semiconductor chips 100 in such a way as to have the same positional relationship with a reference bump electrode 116, from among the plurality of bump electrodes 102, which is provided at a specific location. In this mode of embodiment, a structure comprising a double insulating ring is used as the identification section 104, said structure being formed in such a way as to lie across two adjacent semiconductor chips 100 defined by the dicing area. It should be noted that the identification sections 104 need to be formed only on two orthogonal sides of the semiconductor chip 100. As described above, however, the identification sections 104 are formed in such a way as to lie across two adjacent semiconductor chips 100, so if we look at a particular semiconductor chip 100, the structure comprising a double insulating ring is formed on four sides of that semiconductor chip 100.

FIG. 3 is a view in cross section between A-A' shown in FIG. 2.

The circuit-formation layer 101 is formed on a front surface 105a of a silicon substrate 105.

A predetermined circuit, e.g. a memory circuit, is formed on the circuit-formation layer 101. Furthermore, contact plugs, and a plurality of stacked insulating layers and wiring provided on said plurality of insulating layers are formed on the circuit-formation layer 101, among other things.

A plurality of electrode pads 106 are provided in a predetermined arrangement on the circuit-formation layer 101. The wiring provided on the uppermost layer of the circuit-formation layer 101 is exposed from the front surface of the circuit-formation layer 101 at the locations where the electrode pads 106 are provided, and said wiring is electrically connected to the electrode pads 106. Apart from the regions in which the electrode pads 106 are provided, the circuit-formation layer 101 is covered by an insulating film 107 in order to protect the circuit-formation surface.

Cylindrical bumps (front-surface bumps) 108 comprising Cu or the like are formed on the electrode pads 106.

An Ni plating layer 109 for preventing Cu diffusion is formed on the front-surface bumps 108. Furthermore, an Au plating layer 110 for preventing oxidation is formed on the Ni plating layer 109.

The electrode pad 106, front-surface bump 108, Ni plating layer 109 and Au plating layer 110 form the front-surface bump electrode 102a.

Through-holes are formed in the silicon substrate 105 at positions corresponding to the electrode pads 106. The through-electrodes 103 are formed in the through-holes by filling said through-holes with a conductor layer (e.g., a Cu layer), with a seed layer 111 interposed.

Furthermore, a double insulating ring 112 formed by an insulating member and embedded in a cylindrical shape in such a way as to surround the through-electrodes 103 is formed around said through-electrodes 103 in the silicon substrate 105. The insulating ring 112 is formed in order to provide insulation between the silicon substrate 105 and the through-electrodes 103. In addition, double insulating rings the same as the insulating rings 112 are formed in the silicon substrate 105 as the identification sections 104, in such a way as to lie across two semiconductor chips 100 defined by the dicing area 31. The identification sections 104 can therefore also be formed in the step in which the insulating rings 112 are formed, without the addition of a new step.

A plurality of cylindrical bumps (rear-surface bumps) 113 comprising Cu or the like are formed on a rear surface 105b of the silicon substrate 105 opposite the front surface, with the seed layer 111 interposed. The rear-surface bumps 113 are formed correspondingly with the front-surface bumps 108 and are electrically connected to the corresponding front-surface bump 108 by way of the through-electrode 103.

A hemispherical rear-surface solder layer 114 comprising Sn/Ag is formed on the rear-surface bumps 113.

The rear-surface bump 113 and the rear-surface solder layer 114 form the rear-surface bump electrode 102b.

FIG. 4A depicts a top view of the semiconductor chip 100 shown in FIG. 2, and side views thereof seen from the X-direction and the Y-direction. Furthermore, FIG. 4B is a view in cross section between B-B' shown in FIG. 4A.

The semiconductor chips are cut and separated into individual chips as a result of dicing along the dicing areas 31 of the semiconductor wafer 30 shown in FIG. 2. As mentioned above, the identification sections 104 are formed in such a way as to lie across two adjacent semiconductor chips 100 defined by the dicing areas 31. Furthermore, the identification sections 104 are formed by double insulating rings, as shown in FIG. 3.

The insulating rings constituting the identification sections 104 are therefore cut as a result of the dicing. The insulating rings are then exposed at the side surfaces of the semiconductor chips 100 joining the front and rear surfaces, and identification sections 104 comprising four lines extending in the thickness direction of the semiconductor chips 100 are formed.

The step of forming the chip stack 10 will be described next.

FIG. 5A-5D are views in cross section showing the steps of stacking the semiconductor chips 100.

As shown in FIG. 5A, the semiconductor chip 100b is mounted on a bonding stage 40. A plurality of first suction-adhesion holes 41 are provided in the bonding stage 40 in such a way as to be exposed at the mounting surface on which the semiconductor chip 100b is mounted. The first suction-adhesion holes 41 are connected to a vacuum pump which is not depicted. The semiconductor chip 100b is fixed to the bonding stage 40 by means of suction-adhesion produced by the vacuum pump from the first suction-adhesion holes 41. Here, the semiconductor chip 100b is fixed in such a way that the front surface on which the front-surface bump electrodes 102a are formed is facing upward, i.e. in such a way that the rear surface thereof is in contact with the bonding stage 40. The bump electrodes 102 are not formed on the rear surface of the semiconductor chip 100b, so the semiconductor chip 100b can be fixed on the bonding stage 40 in the correct state.

Next, as shown in FIG. 5B, the semiconductor chip 100a is fixed by means of a bonding tool 42 in such a way that the front surface thereof on which the front-surface bump electrodes 102a are formed is facing upward. A plurality of second suction-adhesion holes 43 are provided in the bonding tool 42 in such a way as to be exposed at the surface to which the semiconductor chip 100a is fixed. The second suction-adhesion holes 43 are connected to a vacuum pump which is not depicted. The semiconductor chip 100a is fixed to the bonding tool 42 by means of suction-adhesion produced by the vacuum pump from the second suction-adhesion holes 43. The semiconductor chip 100a is stacked on the semiconductor chip 100b in such a way that, while a fixed state is produced by the bonding tool 42, the rear-surface bump electrodes 102b of the semiconductor chip 100a and the front-surface bump electrodes 102a of the semiconductor chip 100b are in contact. The rear-surface bump electrodes 102b of the semiconductor chip 100a and the front-surface bump electrodes 102a of the semiconductor chip 100b are then bonded, whereby the semiconductor chips 100 are bonded. Here, the semiconductor chips 100 are stacked in such a way that the side surfaces of the upper and lower semiconductor chips 100 on which the identification sections 104 are formed are oriented in the same direction.

The bump electrodes 102 should be bonded using thermocompression bonding, for example, in which a predetermined load is applied to the semiconductor chips 100 by means of the bonding tool 42 which has been set at a high temperature (of the order of 300° C., for example). It should be noted that it is possible to use not only thermocompression bonding for the bonding, but also ultrasonic compression bonding in which the chips are compression-bonded while ultrasonic waves are applied thereto, or ultrasonic thermocompression bonding which employs the abovementioned bonding processes together.

A third-stage semiconductor chip 100a is fixedly connected on top of the second-stage semiconductor chip 100a by means of the same treatment as described with reference to FIG. 5B, and a fourth-stage semiconductor chip 100a is fixedly connected on top of the third-state semiconductor chip 100a (FIG. 5C).

Four semiconductor chips 100 are stacked by way of the abovementioned steps, as shown in FIG. 5D.

FIG. 6A depicts a top view of the stacked semiconductor chips 100 shown in FIG. 5D, as seen from the fourth-stage semiconductor chip 100a side, and side views seen from the X-direction and the Y-direction.

It should be noted that in FIG. 6A, the four semiconductor chips 100 are stacked in such a way that there is no misalignment between the bump electrodes. In this case, the identification sections 104 of the semiconductor chips 100 are formed in such a way as to have the same positional relationship with a reference bump electrode 116 provided at a specific location, and therefore the identification sections 104 of the semiconductor chips 100 are uniformly positioned. The identification sections 104 are formed in such a way as to be exposed from the side surfaces of the semiconductor chips 100 on four sides of the semiconductor chips 100, so it can be visually confirmed from both the X-direction and the Y-direction that the identification sections 104 of the semiconductor chips 100 are uniformly positioned.

FIG. 6B is a side view seen from the Y-direction and FIG. 6C is a side view seen from the X-direction when the bump electrodes 102 of the stacked semiconductor chips 100 are misaligned.

When the bump electrodes 102 are misaligned, the identification sections 104 of the semiconductor chips 100 are misaligned among the semiconductor chips 100 because the identification sections 104 are formed in such a way as to have the same positional relationship with the reference bump electrode 116 which is provided at a specific location. The identification sections 104 are formed in such a way as to be exposed from the side surfaces of the semiconductor chips 100 on four sides of the semiconductor chips 100, so it can be visually confirmed from both the X-direction and the Y-direction that the identification sections 104 are misaligned.

According to this mode of embodiment, the identification sections 104 are thus provided on the side surfaces of the semiconductor chips 100 in such a way as to have the same positional relationship with the reference bump electrode 116 which is provided at a specific location. When a plurality of semiconductor chips 100 are stacked, it is therefore possible to easily detect misalignment between the bump electrodes, and the extent of any such misalignment, by confirming the state of alignment of the identification sections 104 of the semiconductor chips 100.

It should be noted that FIG. 6A-6C were described with the aid of an example in which the ends of the stacked semiconductor chips 100 are aligned. Here, the distance from the ends of the semiconductor chips 100 to the bump electrodes 102 may differ for each semiconductor chip, depending on the dicing accuracy.

FIG. 7A is a side view of the stacked semiconductor chips 100 seen from the Y-direction and FIG. 7B is a side view seen from the X-direction when a plurality of semiconductor chips 100 for which the distance from the ends to the bump electrodes 102 differs are stacked. It should be noted that there is no misalignment between the bump electrodes in FIGS. 7A and 7B.

The distance from the ends of the semiconductor chips 100 to the bump electrodes 102 differs for each semiconductor chip, so the ends of the semiconductor chips 100 are misaligned when seen from both the X-direction and the Y-direction, as shown in FIGS. 7A and 7B. The identification sections 104 of the semiconductor chips 100 are aligned, however, because there is no misalignment between the bump electrodes 102 of the semiconductor chips 100. The identification sections 104 are formed in such a way as to be exposed from the side surfaces of the semiconductor chip 100 on four sides of the semiconductor chip 100, so it can be visually confirmed from both the X-direction and the Y-direction that the identification sections 104 of the semiconductor chips 100 are uniformly positioned.

As mentioned above, the distance from the ends of the semiconductor chips 100 to the bump electrodes 102 varies for each semiconductor chip, depending on the dicing accuracy, so it is difficult to detect misalignment between the bump electrodes 102 on the basis of the ends of the stacked semiconductor chips 100, and the extent of any such misalignment. In this mode of embodiment, however, the identification sections 104 are provided on the side surfaces of the semiconductor chips 100 in such a way as to have the same positional relationship with the reference bump electrode 116 which is provided at a specific location. This means that even if the ends of the stacked semiconductor chips 100 are misaligned, it is possible to easily detect whether or not misalignment has occurred between the bump electrodes, by confirming the state of alignment of the identification sections 104 of the semiconductor chips 100.

The steps of filling the stacked semiconductor chips with the resin member 11 shown in FIG. 5D will be described next. It should be noted that the steps of filling with the resin member 11 are carried out with respect to an article for which there is deemed to be no misalignment between the bump electrodes 102 as a result of an external inspection based on the positions of the identification sections 104 after the step shown in FIG. 5D.

FIG. 8A-8D are views in cross section showing the steps of filling with the resin member 11.

The stacked semiconductor chips 100 are mounted on a coating sheet 51 affixed to a coating stage 50, for example, as shown in FIG. 8A. A material that has poor wettability with respect to the resin member 11 (which is an underfill material, for example), such as a fluorine-based sheet or a sheet coated with a silicon-based adhesive, is used for the coating sheet 51. It should be noted that the coating sheet 51 does not have to be directly bonded onto the coating stage 50, and the coating sheet 51 may equally be affixed to a predetermined jig etc. mounted on the coating stage 50, provided that the coating sheet 51 is mounted on a flat surface.

As shown in FIG. 8B, an underfill material 53 is then supplied by means of a dispenser 52 from the end region of the stacked semiconductor chips 100 which are mounted on the coating sheet 51. The underfill material 53 which has been supplied enters the gaps between the semiconductor chips 100 due to a capillary phenomenon while forming a fillet around the stacked semiconductor chips 100, and thereby fills the gaps between the semiconductor chips 100.

In this mode of embodiment, a sheet comprising material that has poor wettability with respect to the underfill material 53 is used for the coating sheet 51, so spreading of the underfill material 53 is inhibited and the width of the fillet does not become excessively large.

After the underfill material 53 has been supplied, said underfill material 53 is heat-hardened by curing (heat treating) the stacked semiconductor chips 100 at a predetermined temperature of the order of 150° C., for example, while said stacked semiconductor chips 100 are mounted on the coating sheet 51. As a result, the area around the stacked semiconductor chips 100 is covered by the resin member 11, and a chip stack 10 in which the gaps between the semiconductor chips 100 are filled is formed, as shown in FIG. 8C.

In this mode of embodiment, a sheet comprising a material having poor wettability with respect to the underfill material 53 is used for the coating sheet 51, and therefore this prevents adhesion of the underfill material 53 to the coating sheet 51 during heat-hardening.

After the resin member 11 has been heat-hardened, the chip stack 10 is picked up from the coating sheet 51, as shown in FIG. 8D. In this mode of embodiment, a sheet comprising a material having poor wettability with respect to the underfill material 53 is used for the coating sheet 51, so the chip stack 10 can be easily picked up from the coating sheet 51.

It should be noted that if there is a risk of the stacked semiconductor chips 100 becoming misaligned when the underfill material 53 is supplied, the stacked semiconductor chips 100 may be temporarily anchored to the coating sheet 51 using a resin adhesive, after which the underfill material 53 may be supplied.

The steps of assembling the semiconductor device 1 will be described next.

FIG. 9A-9E are views in cross section showing the steps of assembling the semiconductor device 1. It should be noted that FIG. 9A-9E show an example of assembly steps in which a plurality of semiconductor devices 1 are formed together.

When the semiconductor device 1 is assembled, the wiring board 20 provided with a plurality of product-formation sections 60 arranged in the form of a matrix is first of all prepared, as shown in FIG. 9A. The product-formation sections 60 each constitute a site that will become the wiring board 20 of the semiconductor device 1. Wiring in a predetermined pattern is formed in the product-formation sections 60. The wiring is covered by means of the insulating film 21 such as a solder resist film, excluding the connection pads 22 and the lands 24. The areas between the product-formation sections 60 form dicing lines 61 for when the semiconductor devices 1 are cut into individual devices.

The plurality of connection pads 22 for connecting to the chip stack 10 are formed on one surface of the wiring board 20. The plurality of lands 24 for connecting the conductive solder balls 23 serving as external electrodes are formed on the other surface of the wiring board 20. The connection pads 22 are connected to predetermined lands 24 by means of wiring. The stud bumps 26 are formed on the connection pads 22.

When the wiring board 20 has been fully prepared, the insulating resin member 27, which is a nonconductive paste (NCP), for example, is applied over the product-formation sections 60 using a dispenser, as shown in FIG. 9A.

The rear surface of the semiconductor chip 100b in the chip stack 10 is then suction-adhered and held by a bonding tool or the like, and as shown in FIG. 9B, the chip stack 10 is mounted on the product-formation section 60, and the stud bumps 26 and the front-surface bump electrodes 102a of the semiconductor chip 100a at the very bottom end of the chip stack 10 are bonded using thermocompression bonding, for example. In this case, the space between the chip stack 10 and the wiring board 20 is filled by the adhesive member 27, and the wiring board 20 and chip stack 10 are bonded and fixed. Here, the tapered resin member 11 is formed around the chip stack 10 so it is possible to prevent the adhesive member 27 from spreading upward. As a result, it is possible to reduce bonding defects and damage to the chip stack 10 caused by the adhesive member 27 adhering to the bonding tool.

The wiring board 20 on which the chip stack 10 is stacked is set in a molding die comprising an upper die and a lower die in a transfer mould apparatus which is not depicted, and the process moves to a molding step.

A cavity (not depicted) for covering the plurality of chip stacks 10 as a single batch is formed in the upper die of the molding die, and the chip stacks 10 mounted on the wiring boards 20 are received inside the cavity.

A sealing resin which has been heated and melted is then injected into the cavity provided in the upper die of the molding die, and the sealing resin fills the inside of the cavity in such a way as to cover the whole of the chip stacks 10. A thermosetting resin such as an epoxy resin, for example, is used for the sealing resin.

The sealing resin which fills the inside of the cavity is then heat-hardened by curing at a predetermined temperature of the order of 180° C., for example. As a result, the sealing resin 28 is formed in such a way as to cover, as a single batch, the chip stacks 10 mounted on the plurality of product-formation sections 60, as shown in FIG. 9C. In addition, the sealing resin 28 is completely hardened by baking at a predetermined temperature.

In this mode of embodiment, the gaps between the semiconductor chips 100 in the chip stack 10 are sealed by the resin member 11, after which the sealing resin 28 is formed over the whole of the chip stacks 10, so it is possible to inhibit the formation of voids in the gaps between the semiconductor chips 100.

When the sealing resin 28 is formed, the process moves to a ball mounting step in which the solder balls 23 are connected to the lands 24 formed on the other surface of the wiring board 20, as shown in FIG. 9D.

In the ball mounting step, the plurality of solder balls 23 are suction-adhered and held using a mounting tool provided with a plurality of suction-adhesion holes which are aligned with the lands 24 of the wiring board 20, and flux is transferred to the solder balls 23. After this, the solder balls 23 are connected as a single batch onto the lands 24 of the wiring board 20.

After connection of the solder balls 23 has been completed for all of the product-formation sections 60, the solder balls 23 and the lands 24 are connected by reflow of the wiring board 20.

When connection of the solder balls 23 has been completed, the process moves to a substrate dicing step in which the semiconductor device 1 is formed by cutting and separating the individual product-formation sections 60 using the dicing lines 61.

In the substrate dicing step, the product-formation sections 60 are supported by affixing dicing tape (not depicted) to the sealing resin 28. Each product-formation section 60 is then separated by cutting at the dicing lines 61 using a dicing blade of a dicing apparatus (not depicted), as shown in FIG. 9E. After the cutting and separating, the dicing tape is picked up from the product-formation sections 60, and the CoC semiconductor device 1 shown in FIG. 1 is obtained as a result.

According to this mode of embodiment, the chip stack 10 on which the plurality of semiconductor chips 100 are mounted is produced firstly, after which the chip stack 10 is fixedly connected to the wiring board 20. It is therefore possible to reduce thermal stress applied to the semiconductor chips 100 and the connections of the semiconductor chips 100 in the heat treatment during production as a result of differences in rigidity and thermal expansion coefficient between the semiconductor chips 100 and the wiring boards 20. As a result, it is possible to restrict breakage of the connections between the semiconductor chips 100 and cracking of the semiconductor chips 100.

Furthermore, the resin member 11 (underfill material 53) is supplied to the semiconductor chips 100 which are stacked on the coating sheet 51 comprising a material having poor wettability with respect to the underfill material. The shape of the fillet formed by the underfill material 53 is therefore stabilized and the fillet width can be reduced. As a result, it is possible to curb an increase in the size of the package. In addition, the chip stack 10 can be easily picked up from the coating sheet 51 after the underfill material 53 has been supplied.

In this way, the semiconductor device 1 according to this mode of embodiment is such that the plurality of semiconductor chips 100 each having a plurality of bump electrodes are stacked, the plurality of semiconductor chips 100 comprise the identification sections 104 formed on the side surfaces thereof, the plurality of bump electrodes 102 are arranged in the same way on the semiconductor chips 100, the identification sections 104 are formed in such a way as to have the same positional relationship with the reference bump electrode 116, from among the plurality of bump electrodes 102, which is provided at a specific location, and the plurality of semiconductor chips 100 are stacked in such a way that the bump electrodes 102 provided thereon are electrically connected in the stacking order and in such a way that the side surfaces on which the identification sections 104 are formed are oriented in the same direction.

Furthermore, the semiconductor device 1 according to this mode of embodiment is provided with: the first semiconductor chip (e.g. the semiconductor chip 100b) comprising: a front surface serving as the first main surface, a rear surface serving as the second main surface opposite the front surface, a side surface serving as the first side surface joining the front surface and the rear surface, front-surface bump electrodes 102a serving as the first bump electrodes formed on the front surface, and the identification sections 104 serving as the first identification sections which correspond to the front-surface bump electrodes 102a and are formed on the side surface; and a second semiconductor chip comprising: a rear surface serving as the third main surface, a front surface serving as the fourth main surface opposite the rear surface, a side surface serving as the second side surface joining the front surface and the rear surface, rear-surface bump electrodes 102b serving as second bump electrodes which correspond to the first bump electrodes and are formed on the rear surface, front-surface bump electrodes 102a serving as the third bump electrodes which are electrically connected to the rear-surface bump electrodes 102b and are formed on the front surface, and identification sections 104 serving as the second identification sections which are formed on the second side surface with the same positional relationship with respect to the rear-surface bump electrodes as the positional relationship between the first bump electrodes and the first identification sections, said second semiconductor chip being stacked on the first semiconductor chip in such a way that the second bump electrodes are connected to the first bump electrodes and the first side surface and the second side surface are oriented in the same direction.

In each semiconductor chip 100, the identification sections 104 are formed on the side surfaces of the semiconductor chip 100 in such a way as to have the same positional relationship with the reference bump electrode 116, and the semiconductor chips 100 are stacked in such a way that the identification sections 104 are formed on the side surfaces of the semiconductor chips 100, and the side surfaces on which the identification sections 104 are formed are oriented in the same direction, so when the plurality of semiconductor chips 100 are stacked, it is possible to easily detect misalignment between the bump electrodes 102, and the extent of any such misalignment, by confirming the state of alignment of the identification sections 104 of the semiconductor chips 100.

Second Mode of Embodiment

FIG. 10 is a top view of a semiconductor wafer 30A on which are formed semiconductor chips 100A according to a second mode of embodiment of the present invention.

A structure comprising a double insulating ring was formed as the identification section 104 in the semiconductor wafer 30. In the semiconductor wafer 30A according to this mode of embodiment, however, a linear structure which lies across two adjacent semiconductor chips 100A defined by dicing areas 31, and is orthogonal to dicing lines 31A constituting boundaries which are cut by means of dicing is formed as the identification section.

FIG. 11A depicts a top view of the semiconductor chip 100A and side views of the semiconductor chip 100A seen from the X-direction and the Y-direction. Furthermore, FIG. 11B is a view in cross section between C-C' shown in FIG. 11A.

As shown in FIGS. 11A and 11B, identification sections 104A are formed with a linear shape orthogonal to the ends of the semiconductor chip 100A, on four sides of said semiconductor chip 100A.

In this mode of embodiment also, the identification sections 104A which are at least partly exposed from the side surfaces of the semiconductor chips 100A are provided in such a way as to have the same positional relationship with a reference bump electrode 116 which is provided at a specific location, in the same way as in the first mode of embodiment. When the semiconductor chips 100A are stacked, it is therefore possible to easily detect misalignment between the bump electrodes 102, and the extent of any such misalignment, by confirming the state of alignment of the identification sections 104A of the semiconductor chips 100A.

Furthermore, in the first mode of embodiment the identification sections 104 are formed with a circular shape, whereas in this mode of embodiment the identification sections 104A are formed with a linear shape orthogonal to the dicing lines 31. When the authentication sections 104 are circular, the identification sections 104 may be misaligned if the position where the semiconductor chips are cut is misaligned, due to cutting errors in the dicing step. On the other hand, by forming the identification sections 104A with a linear shape orthogonal to the dicing lines 31 as in this mode of embodiment, there is no misalignment of the identification sections 104A even if there is a cutting error in the dicing step, so the identification sections can be formed with a high degree of precision.

Third Mode of Embodiment

In the semiconductor chip 100A according to the second mode of embodiment, the identification sections 104A were formed on a silicon substrate. In a semiconductor chip 100B according to this mode of embodiment, however, the identification sections are formed in a circuit-formation layer on the silicon substrate.

FIG. 12A depicts a top view of the semiconductor chip 100B and side views of the semiconductor chip 100B seen from the X-direction and the Y-direction. Furthermore, FIG. 12B is a view in cross section between D-D' shown in FIG. 12A.

As shown in FIGS. 12A and 12B, identification sections 104B are formed with a linear shape orthogonal to the ends of the semiconductor chip 100B, on four sides of said semiconductor chip 100B. Here, the identification sections 104B are formed using a wiring pattern of the circuit-formation layer 101.

In this mode of embodiment also, the identification sections 104B which are at least partly exposed from the side surfaces of the semiconductor chips 100B are provided on the semiconductor chips 100B in such a way as to have the same positional relationship with a reference bump electrode 116 which is provided at a specific location, in the same way as in the first and second modes of embodiment. When the semiconductor chips 100B are stacked, it is therefore possible to easily detect misalignment between the bump electrodes 102, and the extent of any such misalignment, by confirming the state of alignment of the identification sections 104B of the semiconductor chips 100B.

Furthermore, in this mode of embodiment the identification sections 104B are formed with a linear shape orthogonal to the dicing lines 31. There is consequently no misalignment of the identification sections 104B even if there is a cutting error in the dicing step, so the identification sections can be formed with a high degree of precision in the same way as in the second mode of embodiment.

Furthermore, in this mode of embodiment the identification sections 104B are formed in the circuit-formation layer 101. This means that there is no need to form a trench in the silicon substrate to be filled with an insulating member and therefore the strength of the semiconductor chip can be improved in comparison with the first and second modes of embodiment. Furthermore, the trench formed in the silicon substrate is likely to become a starting point for cracking of the chip, but in this mode of embodiment there is no need to form the trench in the silicon substrate in order to form the identification sections 104B, so it is possible to reduce the likelihood of chip cracking.

It should be noted that the first to third modes of embodiment describe an exemplary case in which semiconductor chips of the same size are stacked, but the present invention is not limited to this. Provided that the position of the reference bump electrode is the same, it is also possible to apply the present invention to a case in which semiconductor chips having different sizes and circuit configurations are stacked, as shown in FIG. 13. It should be noted that FIG. 13 shows an example in which an interface (IF) chip 100D which controls memory chips 100C and is smaller than said memory chips 100C is stacked on four of these memory chips 100C. As shown in FIG. 13, it is still possible to easily detect misalignment between the bump electrodes, and the extent of any such misalignment, when semiconductor chips of different sizes are stacked, by visually confirming the identification sections from the side surface.

The present invention devised by the present inventor has been described above on the basis of modes of embodiment, but the present invention is not limited to these modes of embodiment and it goes without saying that various modifications may be made within a scope that does not depart from the essential point thereof. For example, in the above-mentioned modes of embodiment, a description was given of a chip stack in which four memory chips are stacked, and a chip stack in which four memory chips and one IF chip are stacked, but the present invention may still be applied whatever kind of semiconductor chips are stacked. Furthermore, the number of semiconductor chips stacked is not limited to four or five, and there may be three or fewer, or six or greater.

Furthermore, the abovementioned modes of embodiment describe a case in which the identification sections are formed with a circular or linear shape, but the identification sections may have any kind of shape provided that they are formed in such a way that the positional relationship with the reference bump is the same.

Furthermore, the abovementioned modes of embodiment describe an example in which the underfill material is supplied after the semiconductor chips have been stacked, but it is equally possible to stack the semiconductor chips to which a transparent resin layer (e.g., a transparent nonconductive film (NCF)) has been affixed and then to melt the NCF at the same time as flip-chip mounting, whereby the gaps between the semiconductor chips are filled. The resin layer is transparent, so even if said resin layer projects from the side surfaces of the semiconductor chip or covers the side surfaces of the semiconductor chip, the identification sections can still be visually confirmed.

This application claims priority on the basis of Japanese Application 2013-130330 filed on Jun. 21, 2013, the disclosure of which is incorporated in its entirety herein.

What is claimed is:

1. A semiconductor device comprising:
a plurality of semiconductor chips each having a plurality of bump electrodes, wherein the plurality of semiconductor chips are stacked, and wherein:
   each semiconductor chip of the plurality of semiconductor chips comprises a semiconductor substrate and only one identification section formed of an insulating member on each side surface of the semiconductor substrate, wherein each identification section comprises two lines of a first material sandwiching a portion of the semiconductor substrate, each line of the first material is formed through an entire thickness of the semiconductor substrate, and the first material is different from the semiconductor substrate;
   the plurality of bump electrodes are arranged in a same way on each of the plurality of semiconductor chips,
   wherein the plurality of bump electrodes on each of the plurality of semiconductor chips comprise a reference bump electrode provided at a specific location, and the identification sections are formed on each of the plurality of semiconductor chips in such a way as to have a same positional relationship with the reference bump electrode; and
   the plurality of semiconductor chips are stacked in such a way that the bump electrodes provided thereon are electrically connected in the stacking order of the semiconductor chips and in such a way that the side surfaces on which the identification sections are formed are oriented in a same direction.

2. The semiconductor device as claimed in claim 1, wherein a structure lying across adjacent semiconductor chips defined by a dicing area is formed on a wafer in which the semiconductor chips are formed, and the identification section is formed by dicing the dicing area.

3. The semiconductor device as claimed in claim 2, wherein the structure is formed with a circular shape.

4. The semiconductor device as claimed in claim 2, wherein the structure is formed with a linear shape orthogonal to a dicing line.

5. The semiconductor device as claimed in claim 2, wherein the structure is formed by filling a trench formed in a substrate of the semiconductor chip with the insulating member.

6. The semiconductor device as claimed in claim 1, wherein the identification section is formed by a wiring pattern in a circuit-formation layer of the semiconductor chip.

7. A semiconductor device comprising:
a first semiconductor chip comprising:
   a first main surface;
   a second main surface opposite the first main surface;
   a first side surface joining the first main surface and the second main surface,
wherein a semiconductor substrate is on the first side surface;
   a first bump electrode formed on the first main surface; and
   a first identification section corresponding to the first bump electrode, wherein the first identification section is the only identification section formed of an insulating member on the first side surface, the first identification section comprising two lines of a first material sandwiching a portion of the semiconductor substrate, each line of the first material is formed through an entire thickness of the semiconductor substrate, and the first material is different from the semiconductor substrate; and
a second semiconductor chip comprising:
   a third main surface;
   a fourth main surface opposite the third main surface;
   a second side surface joining the third main surface and the fourth main surface;
   a second bump electrode corresponding to the first bump electrode, wherein the second bump electrode is formed on the third main surface;
   a third bump electrode electrically connected to the second bump electrode, wherein the third bump electrode is formed on the fourth main surface; and
   a second identification section formed on the second side surface with a same positional relationship with respect to the second bump electrode as a positional relationship between the first bump electrode and the first identification section, said second semiconductor chip being stacked on the first semiconductor chip in such a way that the second bump electrode is configured to be connected to the first bump electrode and the first side surface and the second side surface are oriented in a same direction.

* * * * *